United States Patent
Choy et al.

(10) Patent No.: US 10,700,660 B2
(45) Date of Patent: Jun. 30, 2020

(54) BULK ACOUSTIC WAVE RESONATOR

(71) Applicant: Avago Technologies International Sales Pte. Limited, Singapore (SG)

(72) Inventors: John Choy, Westminster, CO (US); Chris Feng, Fort Collins, CO (US); Phil Nikkel, Loveland, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 92 days.

(21) Appl. No.: 15/793,945

(22) Filed: Oct. 25, 2017

(65) Prior Publication Data

US 2019/0123708 A1    Apr. 25, 2019

(51) Int. Cl.
*H03H 9/54* (2006.01)
*H03H 9/02* (2006.01)
*H03H 9/17* (2006.01)
*H03H 3/02* (2006.01)

(52) U.S. Cl.
CPC .......... *H03H 9/02015* (2013.01); *H03H 3/02* (2013.01); *H03H 9/02118* (2013.01); *H03H 9/02149* (2013.01); *H03H 9/173* (2013.01); *H03H 9/175* (2013.01); *H03H 2003/021* (2013.01)

(58) Field of Classification Search
CPC .................................. H03H 9/54; H03H 9/02
USPC ......................................................... 333/187
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 5,910,756 A | 6/1999 | Ella et al. |
| 6,060,818 A | 5/2000 | Ruby et al. |
| 6,107,721 A | 8/2000 | Lakin |
| 6,262,637 B1 | 7/2001 | Bradley et al. |
| 6,355,498 B1 * | 3/2002 | Chan .................. B81C 1/00142 438/48 |
| 6,384,697 B1 | 5/2002 | Ruby et al. |
| 6,507,983 B1 | 1/2003 | Ruby et al. |
| 6,828,713 B2 | 12/2004 | Bradley et al. |
| 7,212,082 B2 * | 5/2007 | Nagao .................. H01L 41/316 310/324 |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,369,013 B2 | 5/2008 | Fazzio et al. |
| 7,388,454 B2 | 6/2008 | Ruby et al. |
| 7,561,009 B2 | 7/2009 | Larson, III et al. |

(Continued)

OTHER PUBLICATIONS

Co-pending U.S. Appl. No. 15/661,468, filed Jun. 27, 2017.

*Primary Examiner* — Dean O Takaoka
(74) *Attorney, Agent, or Firm* — Foley & Lardner LLP

(57) ABSTRACT

A bulk acoustic wave (BAW) resonator includes: a substrate; an acoustic reflector disposed in the substrate; a first electrode disposed over the acoustic reflector; a second electrode; and a piezoelectric layer between the first and second electrodes. The second electrode is not disposed between the first electrode and the acoustic reflector. The BAW resonator further includes a block disposed over the substrate and beneath the piezoelectric layer. A contacting overlap of the acoustic reflector, the first electrode, the second electrode and the piezoelectric layer defines an active area of the BAW resonator.

24 Claims, 8 Drawing Sheets

(56) References Cited

U.S. PATENT DOCUMENTS

| | | |
|---|---|---|
| 7,629,865 B2 | 12/2009 | Ruby et al. |
| 7,714,684 B2 | 5/2010 | Ruby et al. |
| 7,791,434 B2 | 9/2010 | Fazzio et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,436,516 B2 | 5/2013 | Ruby et al. |
| 8,673,121 B2 | 3/2014 | Larson, III et al. |
| 8,902,023 B2 | 12/2014 | Choy et al. |
| 8,981,876 B2 | 3/2015 | Jamneala et al. |
| 9,088,265 B2 | 7/2015 | Bradley et al. |
| 9,136,819 B2 | 9/2015 | Grannen et al. |
| 9,197,185 B2 | 11/2015 | Zou et al. |
| 9,243,316 B2 | 1/2016 | Larson, III et al. |
| 9,385,684 B2 * | 7/2016 | Nikkel ............... H03H 9/02118 |
| 9,401,691 B2 | 7/2016 | Zou et al. |
| 9,444,428 B2 | 9/2016 | Ruby et al. |
| 9,450,167 B2 | 9/2016 | Zou et al. |
| 9,455,681 B2 | 9/2016 | Feng et al. |
| 9,479,139 B2 | 10/2016 | Ruby et al. |
| 9,484,882 B2 | 11/2016 | Burak et al. |
| 9,490,418 B2 | 11/2016 | Burak et al. |
| 9,520,855 B2 | 12/2016 | Feng et al. |
| 9,525,397 B2 | 12/2016 | Burak et al. |
| 9,548,438 B2 | 1/2017 | Burak et al. |
| 9,564,553 B2 | 2/2017 | Katona et al. |
| 9,571,063 B2 * | 2/2017 | Burak .................... H03H 9/132 |
| 9,571,064 B2 | 2/2017 | Burak et al. |
| 9,577,603 B2 | 2/2017 | Burak et al. |
| 9,590,165 B2 | 3/2017 | Zou et al. |
| 9,602,073 B2 | 3/2017 | Grannen et al. |
| 9,608,592 B2 | 3/2017 | Bi et al. |
| 9,608,594 B2 | 3/2017 | Burak et al. |
| 9,621,126 B2 | 4/2017 | Burak et al. |
| 9,634,642 B2 | 4/2017 | Burak et al. |
| 9,667,220 B2 | 5/2017 | Sridaran et al. |
| 9,679,765 B2 | 6/2017 | Larson, III et al. |
| 9,680,439 B2 | 6/2017 | Nikkel et al. |
| 9,680,445 B2 | 6/2017 | Barfknecht et al. |
| 9,691,963 B2 | 6/2017 | Burak et al. |
| 9,698,753 B2 | 7/2017 | Burak et al. |
| 9,698,754 B2 | 7/2017 | Burak et al. |
| 9,748,918 B2 | 8/2017 | Burak et al. |
| 9,768,353 B2 | 9/2017 | Katona et al. |
| 2005/0248232 A1 * | 11/2005 | Itaya ........................ H03H 3/02 310/320 |
| 2012/0218055 A1 * | 8/2012 | Burak ..................... H03H 9/02 333/187 |
| 2012/0218057 A1 * | 8/2012 | Burak ................. H03H 9/02007 333/191 |
| 2012/0218059 A1 * | 8/2012 | Burak .................... H03H 9/132 333/191 |
| 2012/0326807 A1 | 12/2012 | Choy et al. |
| 2013/0015747 A1 | 1/2013 | Ruby et al. |
| 2014/0118088 A1 * | 5/2014 | Burak ................ H03H 9/02118 333/187 |
| 2014/0118092 A1 * | 5/2014 | Burak .................... H03H 9/132 333/187 |
| 2014/0174908 A1 | 6/2014 | Feng et al. |
| 2014/0176261 A1 * | 6/2014 | Burak .................... H03H 9/132 333/187 |
| 2014/0225683 A1 * | 8/2014 | Burak .................... H03H 9/173 333/187 |
| 2014/0246305 A1 | 9/2014 | Larson, III et al. |
| 2015/0145610 A1 | 5/2015 | Ruby et al. |
| 2015/0240349 A1 | 8/2015 | Grannen et al. |
| 2015/0247232 A1 | 9/2015 | Nikkei et al. |
| 2015/0280687 A1 | 10/2015 | Burak et al. |
| 2015/0280688 A1 | 10/2015 | Ortiz et al. |
| 2015/0311046 A1 | 10/2015 | Yeh et al. |
| 2015/0326200 A1 | 11/2015 | Grannen et al. |
| 2015/0349745 A1 | 12/2015 | Small |
| 2015/0381144 A1 | 12/2015 | Bradley et al. |
| 2016/0079958 A1 | 3/2016 | Burak et al. |
| 2016/0126930 A1 | 5/2016 | Zou et al. |
| 2016/0182011 A1 * | 6/2016 | Burak ................ H03H 9/02102 310/346 |
| 2016/0191015 A1 | 6/2016 | Ivira et al. |
| 2016/0308509 A1 * | 10/2016 | Burak .................... H03H 9/173 |
| 2016/0352306 A1 | 12/2016 | Bradley et al. |
| 2016/0352308 A1 | 12/2016 | Ivira et al. |
| 2017/0047907 A1 | 2/2017 | Burak et al. |
| 2017/0085247 A1 | 3/2017 | Ruby et al. |
| 2017/0155373 A1 | 6/2017 | Ruby et al. |
| 2017/0214387 A1 | 7/2017 | Burak et al. |
| 2017/0288121 A1 | 10/2017 | Burak et al. |
| 2017/0288122 A1 | 10/2017 | Zou et al. |
| 2017/0288628 A1 | 10/2017 | Grannen et al. |
| 2017/0288636 A1 | 10/2017 | Zou et al. |

* cited by examiner

BULK ACOUSTIC WAVE RESONATOR

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, in addition to the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

What is needed, therefore, is an acoustic resonator that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
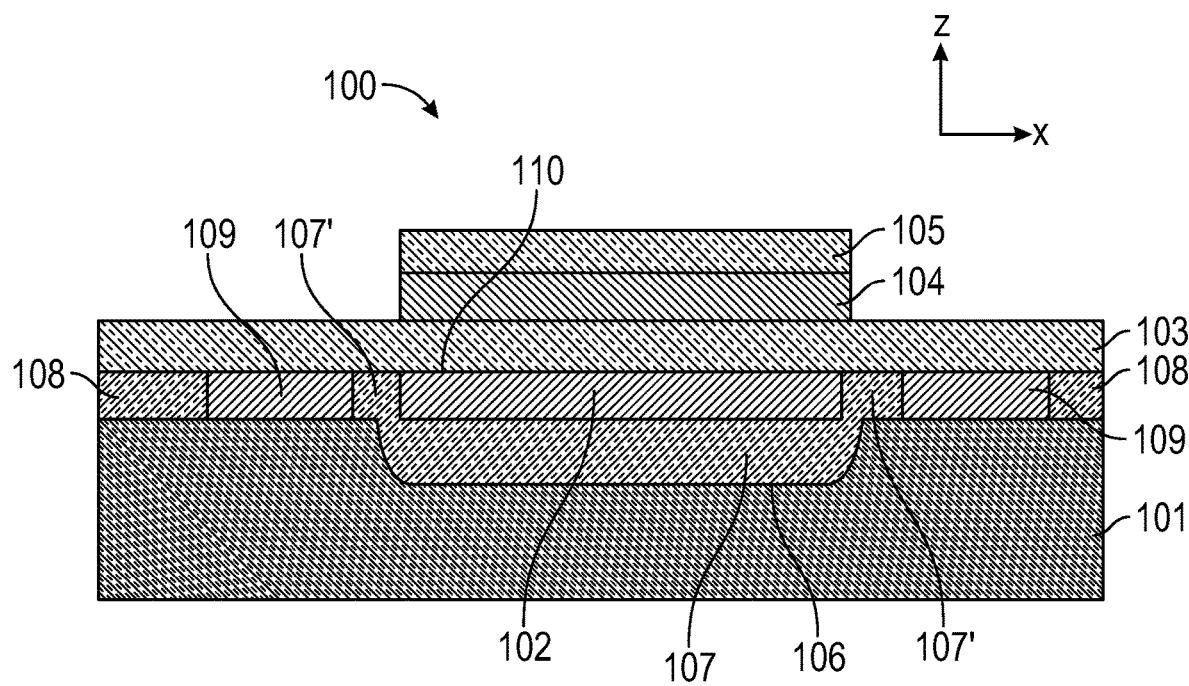
FIGS. 1A and 1B are cross-sectional views of an acoustic resonator in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Unless specified otherwise in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a bulk acoustic wave (BAW) resonator comprises: a substrate; an acoustic reflector disposed in the substrate; a first electrode disposed over the acoustic reflector; a second electrode; and a piezoelectric layer between the first and second electrodes. The second electrode is not disposed between the first electrode and the acoustic reflector. The BAW resonator further comprises a block disposed over the substrate and beneath the piezoelectric layer. A contacting overlap of the acoustic reflector, the first electrode, the second electrode and the piezoelectric layer defines an active area of the BAW resonator.

A variety of structures, materials, and methods of fabrication are contemplated for the BAW resonators of the present teachings. Various details such structures, materials, and methods of fabrication in one or more of the following U.S. patent documents: U.S. Pat. No. 6,107,721, to Lakin; U.S. Pat. Nos. 5,587,620, 5,873,153, 6,507,983, 7,388,454, 7,629,865, 7,714,684, 8,436,516, 9,479,139, 9,444,428, 6,060,818, 6,060,818C1 (ex Parte Reexamination Certificate) and U.S. Patent Application Publication Nos. 20130015747, 20170155373, 20170085247 and 20150145610 to Ruby et al.; U.S. Pat. Nos. 7,369,013, 7,791,434, 8,188,810, and 8,230,562 to Fazzio, et al.; U.S. Pat. Nos. 7,280,007, 9,455,681 and 9,520,855 and U.S. Patent Application Publication No. 20140174908 to Feng et al.; U.S. Pat. Nos. 8,248,185 and 8,902,023 and U.S. Patent Application Publication No. 20120326807 to Choy, et al.; U.S. Pat. Nos. 7,345,410, 9,136,819 and 9,602,073 and U.S. Patent Application Publication Nos. 20170288628, 20150326200 and 20150240349 to Grannen, et al.; U.S. Pat. Nos. 6,828,713 and 9,088,265 and U.S. Patent Application Publication Nos. 20160352306 and 20150381144 to Bradley, et al.; U.S. Pat. Nos. 7,561,009, 7,358,831, 9,243,316, 8,673,121 and 9,679,765 and U.S. Patent Application Publication No. 20140246305 to Larson, III et al.; U.S. Pat. Nos. 9,197,185, 9,450,167, 9,590,165, 9,401,691 and 9,590,165 and U.S. Patent Application Publication Nos. 20170288636, 20170288122 and 20160126930 to Zou, et al.; U.S. Pat. No. 8,981,876 to Jamneala et al.; U.S. Pat. Nos. 9,484,882, 9,571,063, 9,621,126, 9,691,963, 9,698,754, 9,608,594, 9,634,642, 9,548,438, 9,698,753, 9,577,603, 9,525,397, 9,748,918, 9,484,882, 9,571,064 and 9,490,418 and U.S. Patent Application Publication Nos. 20170288121, 20170214387, 20170047907, 20160308509, 20160079958 and 20150280687 to Burak, et al.; U.S. Pat. Nos. 9,768,353 and 9,564,553 to Katona, et al.; U.S. Patent Application Publication Nos. 20160352308 and 20160191015 to Ivira, et al.; U.S. Pat. No. 9,680,445 to Barfknecht, et al.; U.S. Patent Application Publication No. 20150349745 to Small; U.S. Patent Application Publication No. 20150311046 to Yeh, et al.; U.S. Patent Application Publication No. 20150280688 to Ortiz, et al.; U.S. Pat. No. 9,680,439 and U.S. Patent Application Publication No. 20150247232 to Nikkel, et al.; U.S. Pat. No. 9,667,220 to Sridaran, et al.; U.S. Pat. No. 9,608,592 to Bi, et al.; and U.S. patent application Ser. No. 15/661,468 to Ruby, et al., and filed on Jun. 27, 2017. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

FIG. 1A is a cross-sectional view of BAW resonator 100 prior to a final processing step in accordance with a representative embodiment. The BAW resonator 100 comprises a substrate 101, and a first electrode 102 disposed beneath a piezoelectric layer 103, which comprises a first surface in contact with the first electrode 102 and a second surface in contact with a second electrode 104. An optional passivation layer 105 is provided over the second electrode 104.

The BAW resonator 100 is disposed over a cavity 106, which is filled with a first sacrificial layer 107. A second sacrificial layer 108 is disposed over an upper surface of the substrate 101, and blocks 109 are disposed over the upper surface of the substrate 101, and between portions 107' of first sacrificial layer 107, which are disposed on opposing sides of the first electrode 102.

As will be described more fully below in connection with the representative embodiments of FIGS. 5A-5I, the blocks 109, the portions 107' and the second sacrificial layer 108 allow formation of a substantially planar upper surface 110 of the first electrode 102. Moreover, the substantially planar upper surface 110 also protects the second sacrificial layer 108 during processing that has not yet been removed/released. Notably, while it is useful to provide the degree of planarity of the substantially planar upper surface 110 of the first electrode 102 so that a highly textured piezoelectric layer can be formed thereover, this degree of planarity can extend across the blocks 109 and second sacrificial layer 108. Therefore, in some representative embodiments, the substantially planar upper surface 110 is provided as the upper surface of the first electrode 102, and across the blocks 109 and second sacrificial layer 108. Alternatively, the substantially planar upper surface 110 applies only to the upper surface of the first electrode 102.

The substantially planar upper surface 110 of the first electrode enables the formation of a substantially defect-free highly-textured piezoelectric layer 103, such as aluminum nitride (AlN), which may be doped with Scandium or Ytterbium. To this end, in known devices voids can form due to grain orientation change at any distinct edge which has a change in its surface profile. These voids (defects) can degrade the mechanical integrity of the BAW resonator 100, and result in comparatively poor electrical conductivity.

In order to realize substantially defect-free highly-textured piezoelectric layer 103, the degree of planarity of the substantially planar upper surface 110 is referred to herein as "atomically smooth." As used herein, an atomically smooth surface has an RMS variation in height of in the range of approximately 0.1 Å to approximately 10.0 Å; although beneficially, the RMS variation in height is less than approximately 5.0 Å. In some embodiments, the RMS variation in height of the substantially planar upper surface 110 is less than approximately 5.0 µM.

By contrast, in certain known structures, such degrees of smoothness in the upper surface on which the piezoelectric layer is grown are not realized. Moreover, the sides of the first electrode extend over the edge of the cavity 106 on the connection side, and are often sloped. The sloped sides, and non-planar surface in certain known BAW resonators result in defects in the piezoelectric layer formed over the upper surface of the lower electrode, especially at the transition of the lower electrode onto the upper surface of the substrate. These defects are undesirable, and can result in reductions in the overall performance (e.g., Q and $k_t^2$, described below) of known BAW resonators, or require additional processing steps to realize acceptable performance, or both.

Figure 1B:
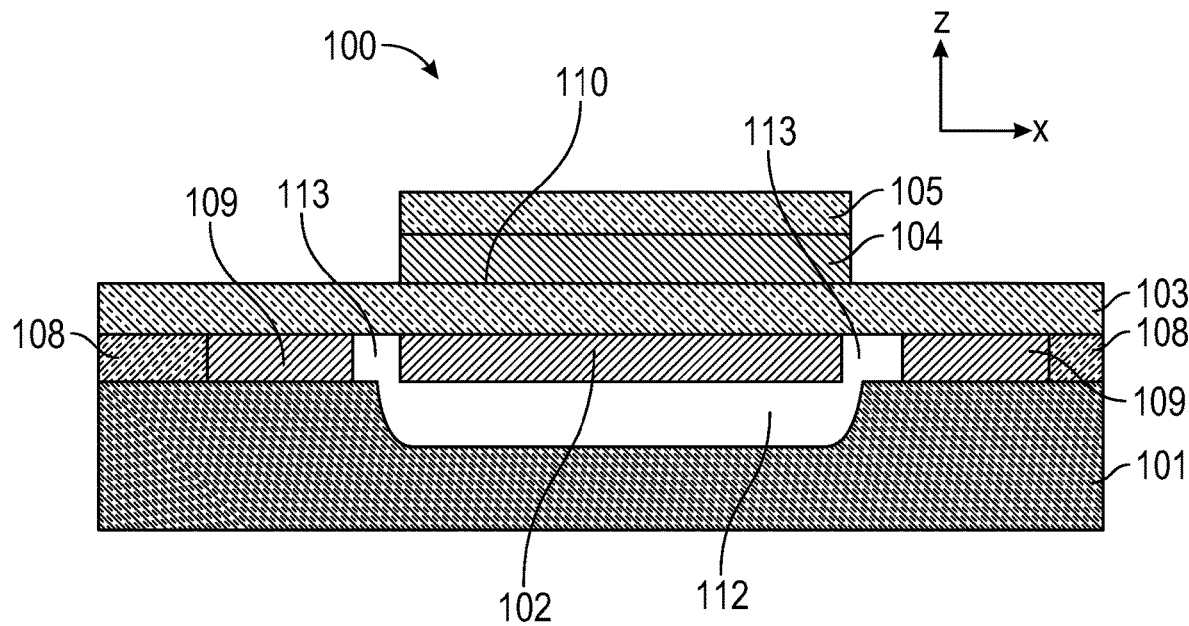

FIG. 1B shows the BAW resonator 100 after selective removal of the first sacrificial layer 107, and portions 107' by one of a number of known methods, for example as described in the above-referenced commonly owned U.S.

Pat. No. 6,384,697 to Ruby, et al. The removal of the first sacrificial layer 107 and portions 107' reveals the acoustic reflector 112, and spaces 113 on opposing ends of the first electrode 102. However, and as described more fully below in connection with the representative embodiments of FIGS. 5A-5I, the second sacrificial layer 108 is not removed.

In accordance with representative embodiments, the second electrode 104 is not disposed between the first electrode 102 and the acoustic reflector 112. Stated somewhat differently, the first electrode 102 is always disposed between the piezoelectric layer 103 and the acoustic reflector 112. By virtue of the structure of BAW resonator 100 of the present teachings, the piezoelectric layer 103 is grown over the substantially planar upper surface 110 of the first electrode 102, the second sacrificial layer 108, and the substrate 101 without an upper bridge. As such, the spaces 113 decouple portions of the acoustic stack, whereas in known BAW resonator structures a top electrode air-bridge is required to acoustically decouple portions of the layer structure when the bottom electrode extends over an edge of the acoustic reflector and the substrate The second electrode 104 provides an electrical connection via the upper side of the BAW resonator 100. By contrast, the first electrode 102 does not extend over all sides of the acoustic reflector 112, and thus is substantially suspended over the acoustic reflector 112, such as described in above-referenced U.S. patent application Ser. No. 15/661, 468 to Ruby, et al. The active area of the BAW resonator 100, which is the area of contacting overlap of the first and second electrodes 102, 104, the piezoelectric layer 103 and the acoustic reflector 112, is thus disposed over the acoustic reflector 112. By contrast, an inactive area of the BAW resonator 100 comprises a region of overlap between the second electrode 104 and the piezoelectric layer 103 not disposed over the acoustic reflector 112. As is known, it is beneficial to the performance of the BAW resonator 100 to reduce the area of the inactive region of the BAW resonator 100 to the extent practical. Beneficially, by the present teachings, the first electrode 102 of the structure of the BAW resonator 100 effectively sets the areal dimension of the active area through the selection of its size. Moreover, in certain structures, it is useful to provide an electrical connection only between two "top" electrodes or between a "top" and a "bottom" electrode (e.g., as described in above-incorporated U.S. Patent Application Publication No. 20160191015 to Ivira, et al.). By the present teachings, which can be readily incorporated at wafer-scale fabrication, these types of electrical connections are more readily realized.

Figure 2A:
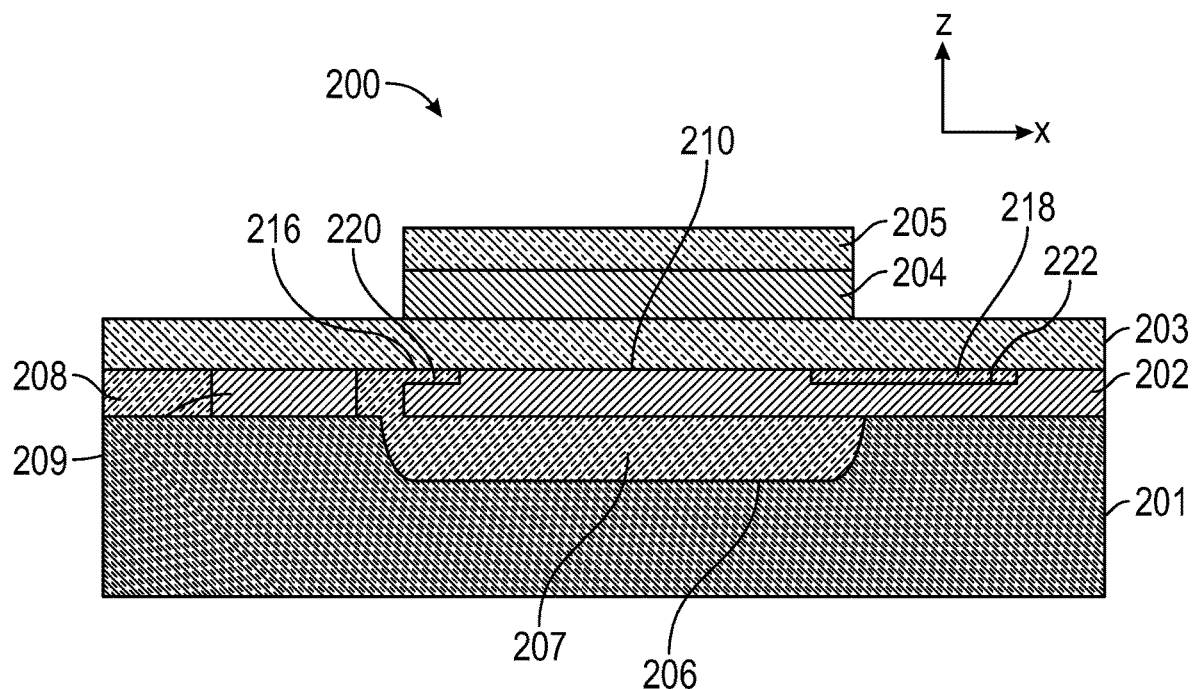
FIGS. 2A and 2B are cross-sectional views of an acoustic resonator in accordance with a representative embodiment.
Figure 2B:
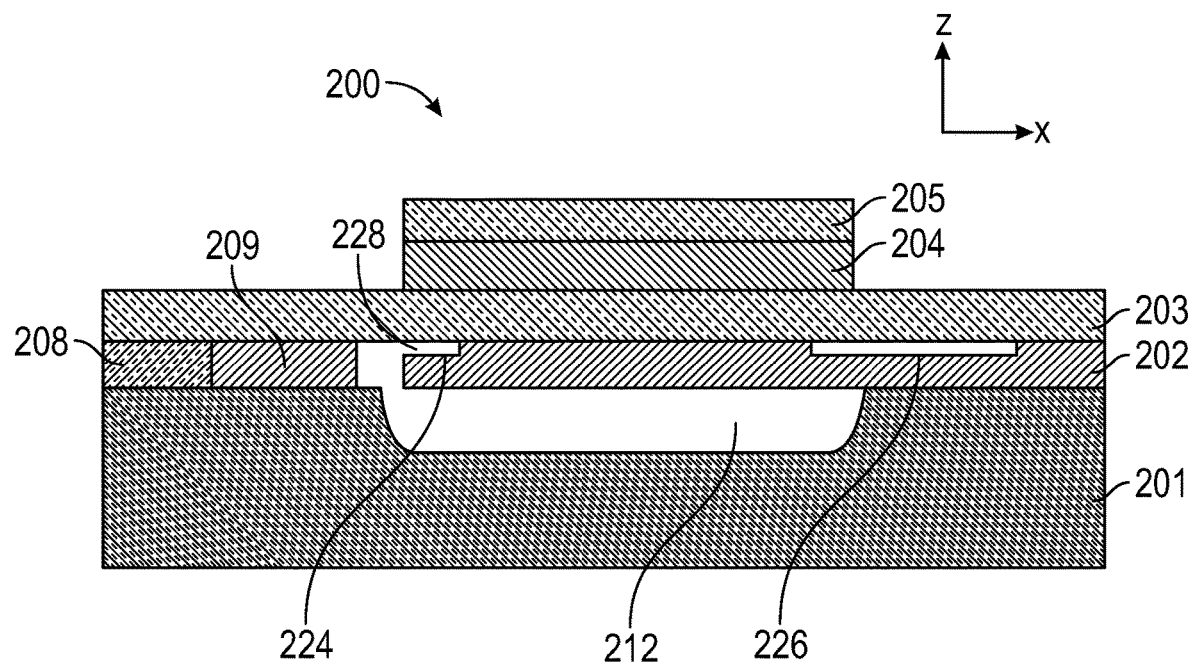

FIGS. 2A-2B are cross-sectional views of BAW resonator 200 in accordance with a representative embodiment. Many aspects and details of the various components of the BAW resonator 200 are common to those described above in connection with representative embodiments of FIGS. 1A and 1B. These common aspects and details are not necessarily repeated, but are nonetheless contemplated by the description of the BAW resonator 200.

FIG. 2A is a cross-sectional view of BAW resonator 200 prior to a final processing step in accordance with a representative embodiment. The BAW resonator 200 comprises a substrate 201, and a first electrode 202 disposed beneath a piezoelectric layer 203, which comprises a first surface in contact with the first electrode 202 and a second surface in contact with a second electrode 204. An optional passivation layer 205 is provided over the second electrode 204.

The BAW resonator 200 is disposed over a cavity 206, which is filled with a first sacrificial layer 207. A second sacrificial layer 208 is disposed over an upper surface of the substrate 201, and a block 209 is disposed over the upper surface of the substrate 201. The first electrode 202 has a recess 220, which is substantially filled by a first portion 216 of the second sacrificial layer 208. The first electrode 202 also has an opening 222, which is substantially filled by a second portion 218 of the second sacrificial layer 208.

Like other embodiments described herein, the block 209, the second sacrificial layer 208, and the first and second portions 216, 218 contribute to the formation of a substantially planar upper surface 210, enabling the formation of a substantially defect-free highly-textured piezoelectric layer 103, such as aluminum nitride (AlN), which may be doped with Scandium or Ytterbium.

Next, the first electrode 202, the block 209, the recess 220, and the opening 222 are formed using a known (dry) plasma etch after the selective deposition of masks (not shown) in regions where etching is not desired. Just by way of example, the plasma etching method used may be the known "Bosch" method, which enables comparatively precise, and as desired, high-aspect ratio etching.

After completion of the etching to form the block 209, recess 220, and opening 222, the second sacrificial layer 208 (e.g., PSG) is deposited and fills the regions adjacent to the block 209, and provides first and second portions 216, 218. As described more fully below in connection with the representative embodiments of FIGS. 5A-5I, a second CMP is then carried out, again, for example, according to the teachings of above-referenced U.S. Pat. Nos. 6,060,818, and 6,060,818C1 (Reexamination Certificate), to Ruby et al. The resultant substantially planar upper surface 210 of the first electrode 202 has an RMS variation in height described above. As noted above, this allows for the growth of a substantially defect-free piezoelectric layer 203. Again, as noted above, among other benefits, the providing of the substantially planar upper surface 210 using the first and second portions 216, 218, the second sacrificial layer 108, and the block 209, fosters growth of a higher quality piezoelectric layer 203, which is beneficially highly textured, and improvement in the performance of the BAW resonator 200. Notably, while it is useful to provide the degree of planarity of the substantially planar upper surface 210 of the first electrode 202 so that a highly textured piezoelectric layer can be formed thereover, this degree of planarity can extend across the block 209 and second sacrificial layer 208. Therefore, in some representative embodiments, the substantially planar upper surface 210 is provided as the upper surface of the first electrode 202, and across the block 209 and second sacrificial layer 208. Alternatively, the substantially planar upper surface 210 applies only to the upper surface of the first electrode 202.

FIG. 2B shows the BAW resonator 200 after selective removal of the first sacrificial layer 207, and first and second portions 216, 218 by one of a number of known methods, for example as described in the above-referenced commonly owned U.S. Pat. No. 6,384,697 to Ruby, et al. Notably, the block 209 prevents removal of the second sacrificial layer 208 adjacent thereto, which is useful in providing the desired degree of planarity of the substantially planar upper surface 210.

The removal of the first sacrificial layer 207 and first and second portions 216, 218 reveals an acoustic reflector 212, a cantilever 224 (sometimes referred to in the art as a 'wing') and a bridge 226 on opposing ends of the first electrode 202. Notably, the second electrode 204 is not disposed between the first electrode 202 and the acoustic reflector 212. Stated somewhat differently, the first electrode 202 is always disposed between the piezoelectric layer 203 and the acoustic reflector 212.

Furthermore, and as described more fully below in connection with the representative embodiments of FIGS. 5A-5I, the second sacrificial layer 208 immediately adjacent to the block 209 is not removed.

The cantilever 224 of the first electrode 202 extends over a gap 228, and effectively terminates the contacting overlap of the first electrode 202 with the acoustic reflector 212, the piezoelectric layer 203, and the first electrode 202 with the non-contacting sides of the first electrode 202. Generally, the cantilever 224 is provided on at least one of the sides of the first electrode 202, but is not disposed on the connection side (i.e., the side of the first electrode 202 extending onto the substrate 201). Furthermore, the cantilever 224 is illustratively disposed over the acoustic reflector 212.

The bridge 226 extends over an edge of the acoustic reflector 212 at the interface of the acoustic reflector 212 and the substrate 201 as shown, and effectively terminates the contacting overlap of the first electrode 202 with the acoustic reflector 212, the piezoelectric layer 203, and the second electrode 204, on the connection side of the first electrode 202.

The region of contacting overlap of the first and second electrodes 202, 204, the piezoelectric layer 203 and the acoustic reflector 212 is the active area of the BAW resonator 200. By contrast, an inactive area of the BAW resonator 200 comprises a region of overlap between first electrode 202, or the second electrode 204, or both, and the piezoelectric layer 203 not disposed over the acoustic reflector 212. As is known, it is beneficial to the performance of the BAW resonator 200 to reduce the magnitude of the area (i.e., the areal dimension) of the inactive region to the extent practical.

The fundamental mode of the BAW resonator 200 is the longitudinal extension mode or "piston" mode. This mode is excited by the application of a time-varying voltage to the two electrodes at the resonant frequency of the BAW resonator 200. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q-factor of the device. For instance, and in addition to the sources of acoustic losses mentioned above, Rayleigh-Lamb (lateral or spurious) modes are in the x,z dimensions of the piezoelectric layer 203. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective velocities between the regions where electrodes are disposed and the surrounding regions of the resonator where there are no electrodes. At a specific frequency, the acoustic wave length of a BAW resonator is determined by v/f, where v is acoustic velocity and f is frequency. It is believed that periodicity of Qp (i.e., the position of maxima and minima as a function of the width of the cantilever 224) is related to the acoustic wave length. At a maxima of Qp, the vibration of the cantilever 224 is comparatively far from its mechanical resonance; while at a minima mechanical resonance of the cantilever 224 occurs.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic losses, sharp reductions in Q can be observed on a Q-circle of the Smith Chart of the $S_{11}$ parameter. These sharp reductions in Q-factor are known as "rattles" or "loop-de-loops," which are shown and described below.

The cantilevered portion(s) 224 of the representative embodiments provide a change in the acoustic impedance at the boundary of the active area of the BAW resonator 200. As a result, reflections of lateral modes at the boundary are promoted. In a representative embodiment, the boundary of the active area of the BAW resonator 200 and the cantilever 224 is solid (electrodes and piezoelectric layer) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area of the BAW resonator 200 can increase the Q-factor of the BAW resonator 200. Second, a portion of the reflected lateral modes is converted into desired longitudinal modes. The greater the wave energy is in longitudinal modes, the higher the Q-factor. As a result, the cantilevered portion(s) 224 of the BAW resonator 200 enhances the Q-factor of both the parallel and the series resonance (i.e., $Q_p$ and $Q_s$).

Similarly, the bridge 226 also provides an improvement in the Q-factor. Beneficially, the combination of the cantilever 224 and the bridge 226 provides a further improvement in the Q-factor of the BAW resonator 200. To this end, inclusion of the bridge 226 with the cantilever 224 in the BAW resonator 200 results in an improvement in the Q-factor at parallel resonance (Qp) and some impact on the Q-factor at series resonance (Qs). This is somewhat expected since the bridge 226 predominantly impacts Qp.

Figure 3A:
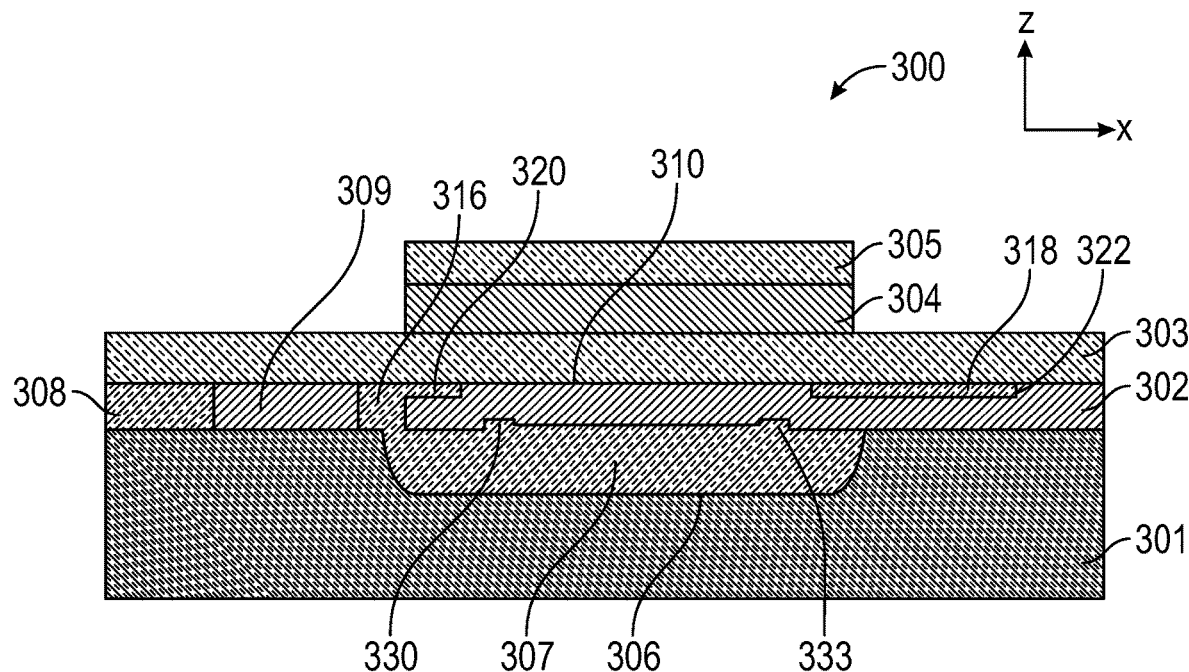
FIGS. 3A and 3B are cross-sectional views of an acoustic resonator in accordance with a representative embodiment.
Figure 3B:
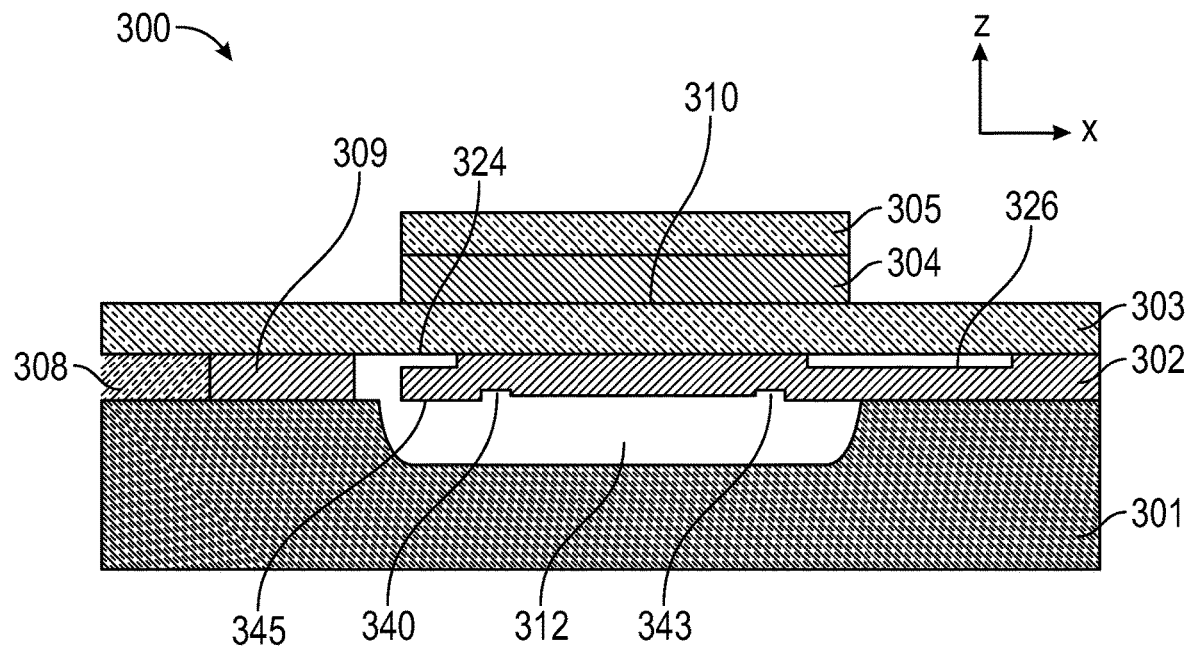

FIGS. 3A-3B are cross-sectional views of BAW resonator 300 in accordance with a representative embodiment. Many aspects and details of the various components of the BAW resonator 300 are common to those described above in connection with representative embodiments of FIGS. 1A through 2B. These common aspects and details are not necessarily repeated, but are nonetheless contemplated by the description of the BAW resonator 300.

FIG. 3A is a cross-sectional view of BAW resonator 300 prior to a final processing step in accordance with a representative embodiment. The BAW resonator 300 comprises a substrate 301, and a first electrode 302 disposed beneath a piezoelectric layer 303, which comprises a first surface in contact with the first electrode 302 and a second surface in contact with a second electrode 304. An optional passivation layer 305 is provided over the second electrode 304.

The BAW resonator 300 is disposed over a cavity 306, which is filled with a first sacrificial layer 307. A second sacrificial layer 308 is disposed over an upper surface of the substrate 301, and a block 309 is disposed over the upper surface of the substrate 301. The first electrode 302 has a first recess 320, which is substantially filled by a first portion 316 of the second sacrificial layer 308. The first electrode 302 also has an opening 322, which is substantially filled by a second portion 318 of the second sacrificial layer 308. Finally, the first electrode 302 has a second recess 330 and a third recess 333 disposed on a side opposing the side of the first electrode 302 over which the piezoelectric layer 303 is disposed. As such, the second and third recesses 330, 333 are disposed on the surface of the first electrode 302 that is immediately adjacent to the cavity 306.

Like other embodiments described herein, the block 309, the second sacrificial layer 308, and the first and second portions 316, 318 contribute to the formation of a substantially planar upper surface 310, enabling the formation of a substantially defect-free highly-textured piezoelectric layer 103, such as aluminum nitride (AlN), which may be doped with Scandium or Ytterbium.

As described more fully below in connection with the representative embodiments of FIGS. 5A-5I, the first electrode 302, the block 309, the first recess 320, the opening 322, the second recess 330 and the third recess 333 are formed using a known (dry) plasma etch after the selective deposition of masks (not shown) in regions where etching is not desired. Just by way of example, the plasma etching method used may be the known "Bosch" method, which enables comparatively precise, and as desired, high-aspect ratio etching.

After completion of the etching to form the block 309, first recess 320, and opening 322, the second sacrificial layer 308 (e.g., PSG) is deposited and fills the regions adjacent to the block 309, and provides first and second portions 316, 318. As described more fully below in connection with the representative embodiments of FIGS. 5A-5I, a second CMP is then carried out, again, for example, according to the teachings of U.S. Pat. Nos. 6,060,818, and 6,060,818C1 (Reexamination Certificate), to Ruby et al. The resultant substantially planar upper surface 310 of the first electrode 302 has an RMS variation in height described above. As noted above, this allows for the growth of a substantially defect-free piezoelectric layer 303. Again, as noted above, among other benefits, the providing of the substantially planar upper surface 310 using the first and second portions 316, 318, the second sacrificial layer 308, and the block 309, fosters growth of a higher quality piezoelectric layer 303, which is substantially defect free, and improvement in the performance of the BAW resonator 300. Notably, while it is useful to provide the degree of planarity of the substantially planar upper surface 310 of the first electrode 302 so that a highly textured piezoelectric layer can be formed thereover, this degree of planarity can extend across the block 309 and second sacrificial layer 308. Therefore, in some representative embodiments, the substantially planar upper surface 310 is provided as the upper surface of the first electrode 302, and across the block 309 and second sacrificial layer 308. Alternatively, the substantially planar upper surface 310 applies only to the upper surface of the first electrode 302.

FIG. 3B shows the BAW resonator 300 after selective removal of the first sacrificial layer 307, and first and second portions 316, 318 by one of a number of known methods, for example as described in referenced commonly owned U.S. Pat. No. 6,384,697 to Ruby, et al. Notably, the block 309 prevents removal of the second sacrificial layer 308 adjacent thereto, which is useful in providing the desired degree of planarity of the substantially planar upper surface 310.

The removal of the first sacrificial layer 307 and first and second portions 316, 318 reveals an acoustic reflector 312, a cantilever 324, and a bridge 326 on opposing ends of the first electrode 302. Notably, the second electrode 304 is not disposed between the first electrode 302 and the acoustic reflector 312. Stated somewhat differently, the first electrode 302 is always disposed between the piezoelectric layer 303 and the acoustic reflector 312.

Furthermore, and as described more fully below in connection with the representative embodiments of FIGS. 5A-5I, the second sacrificial layer 308 immediately adjacent to the block 309 is not removed.

Moreover, the removal of the first sacrificial layer 307 reveals first and second recessed frame elements ("innies") 340, 343, and a raised frame element 345. As shown in FIG. 3B, first and second recessed frame elements 340, 343, and the raised frame element are disposed on the surface of the first electrode 302 that is immediately adjacent to the acoustic reflector 312. Moreover, the first and second recessed frame elements 340, 343, and the raised frame element 345 are disposed over the acoustic reflector 312.

The cantilever 324 of the first electrode 302 extends over a gap 328, and effectively terminates the contacting overlap of the first electrode 302 with the acoustic reflector 312, the piezoelectric layer 303, and the second electrode 304 with the non-contacting sides of the first electrode 302. Generally, the cantilever 324 is provided on at least one of the sides of the first electrode 302, but is not disposed on the connection side (i.e., the side of the first electrode 302 extending onto the substrate 301). Furthermore, the cantilever 324 is illustratively disposed over the acoustic reflector 312.

The bridge 326 extends over an edge of the acoustic reflector 312 as shown, and effectively terminates the contacting overlap of the first electrode 302 with the acoustic reflector 312, the piezoelectric layer 303, and the second electrode 304, on the connection side of the first electrode 302.

The region of contacting overlap of the first and second electrodes 302, 304, the piezoelectric layer 303 and the acoustic reflector 312 is the active area of BAW resonator 300. By contrast, an inactive area of the BAW resonator 300 comprises a region of overlap between first electrode 302, or the second electrode 304, or both, and the piezoelectric layer 303 not disposed over the acoustic reflector 312. As is known, it is beneficial to the performance of the BAW resonator 300 to reduce the magnitude of the area (i.e., the areal dimension) of the inactive region to the extent practical.

The first and second recessed frame elements 340,343 may be disposed along one or more sides of the first electrode 302 of the BAW resonator 300, and on the surface of the first electrode 302 that is immediately adjacent to the acoustic reflector 312. The first and second recessed frame elements 340, 343 provide an acoustic mismatch at the perimeter of the first electrode 302, thereby improving signal reflections and reducing acoustic losses. Ultimately, reduced losses translate into an improved Q-factor of the device.

Finally, and although not depicted in FIGS. 3A and 3B, raised frame elements ("outies") may be provided over one or more sides/edges of the first electrode 302, and are generally provided over the surface of the first electrode 302 that is immediately adjacent to the acoustic reflector 312. Like first and second recessed frame elements 340, 343, these raised frame elements provide an acoustic mismatch at the perimeter of the first electrode 302, thereby improving signal reflections and reducing acoustic losses. Ultimately, reduced losses translate into an improved Q-factor of the device.

Figure 4A:
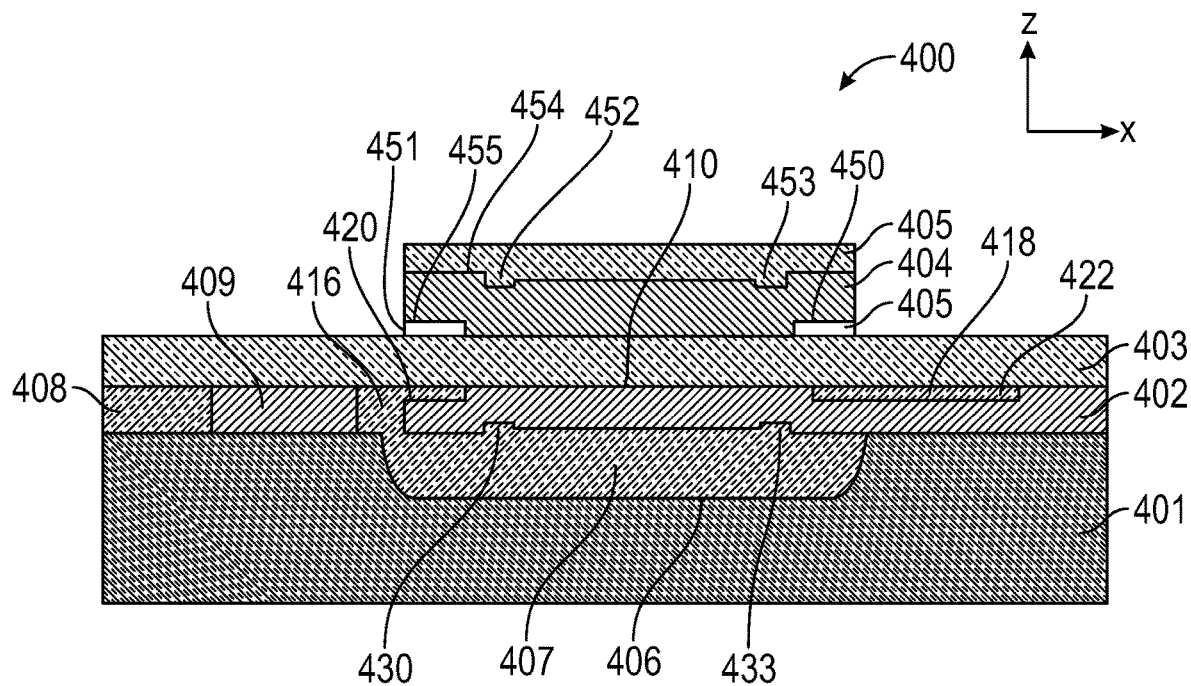
FIGS. 4A and 4B are cross-sectional views of an acoustic resonator in accordance with a representative embodiment.
Figure 4B:
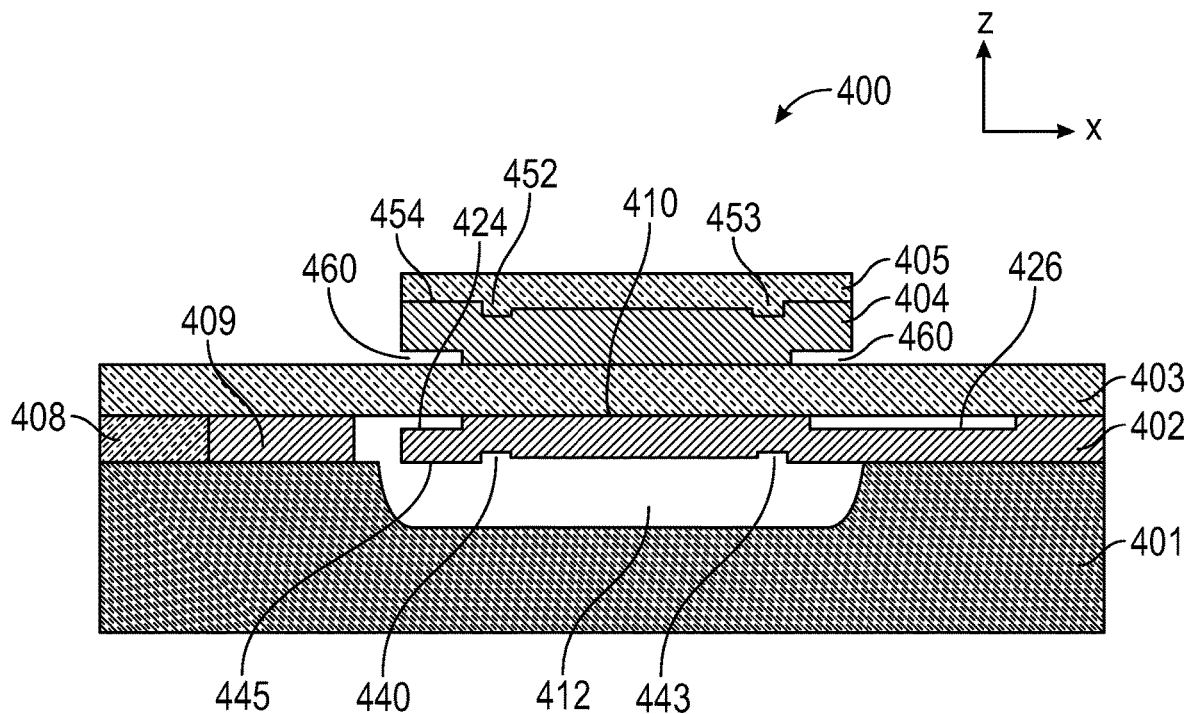

FIGS. 4A-4B are cross-sectional views of BAW resonator 400 in accordance with a representative embodiment. Many aspects and details of the various components of the BAW resonator 400 are common to those described above in connection with representative embodiments of FIGS. 1A through 3B. These common aspects and details are not necessarily repeated, but are nonetheless contemplated by the description of the BAW resonator 400.

FIGS. 4A-4B are cross-sectional view of a BAW resonator 400 prior to a final processing step in accordance with a representative embodiment. The BAW resonator 400 comprises a substrate 401, a first electrode 402 disposed beneath a piezoelectric layer 403, which comprises a first surface in contact with the first electrode 402 and a second surface in contact with a second electrode 404. An optional passivation layer 405 is provided over the second electrode 404.

The BAW resonator 400 is disposed over a cavity 406, which is filled with a first sacrificial layer 407. A second sacrificial layer 408 is disposed over an upper surface of the substrate 401, and a block 409 is disposed over the upper surface of the substrate 401. The first electrode 402 has a first recess 420, which is substantially filled by a first portion 416 of the second sacrificial layer 408. The first electrode 402 also has an opening 422, which is substantially filled by a second portion 418 of the second sacrificial layer 408. Finally, the first electrode 402 has a second recess 430 and a third recess 433 disposed on a side opposing the side of the first electrode 402 over which the piezoelectric layer 403 is disposed. As such, the second and third recesses 430, 433 are disposed on the surface of the first electrode 402 that is immediately adjacent to the cavity 406.

The second electrode 404 of BAW resonator 400 also comprises a fifth recess 450, a sixth recess 451, a seventh recess 452, and an eighth recess 453. Moreover, the second electrode 404 comprises a first raised frame element 454 disposed on an outer portion of at least one of its sides. In accordance with a representative embodiment, a fifth recess 450, and a sixth recess 451 are substantially filled with a third sacrificial layer 455.

Like other embodiments described herein, the block 409, the second sacrificial layer 408, and the first and second portions 416, 418 contribute to the formation of a substantially planar upper surface 410, enabling the formation of a substantially defect-free highly-textured piezoelectric layer 103, such as aluminum nitride (AlN), which may be doped with Scandium or Ytterbium.

As described more fully below in connection with the representative embodiments of FIGS. 5A-5I, the first electrode 402, the block 409, the first recess 420, the opening 422, the second recess 430 and the third recess 433 are formed using a known (dry) plasma etch after the selective deposition of masks (not shown) in regions where etching is not desired. Just by way of example, the plasma etching method used may be the known "Bosch" method, which enables comparatively precise, and as desired, high-aspect ratio etching.

After completion of the etching to form the block 409, first recess 420, and opening 422, the second sacrificial layer 408 (e.g., PSG) is deposited and fills the regions adjacent to the block 409, and provides first and second portions 416, 418. As described more fully below in connection with the representative embodiments of FIGS. 5A-5I, a second CMP is then carried out, again, for example, according to the teachings of U.S. Pat. Nos. 6,060,818, and 6,060,818C1 (Reexamination Certificate), to Ruby et al. The resultant substantially planar upper surface 410 of the first electrode 402 has an RMS variation in height described above. As noted above, this allows for the growth of a substantially defect-free piezoelectric layer 403. Again, as noted above, among other benefits, providing the substantially planar upper surface 410 using the first and second portions 416, 418, the second sacrificial layer 108, and the block 409, fosters growth of a higher quality piezoelectric layer 403, which is highly-textured, and improvement in the performance of the BAW resonator 400. Notably, while it is useful to provide the degree of planarity of the substantially planar upper surface 410 of the first electrode 402 so that a highly textured piezoelectric layer can be formed thereover, this degree of planarity can extend across the block 409 and second sacrificial layer 408. Therefore, in some representative embodiments, the substantially planar upper surface 410 is provided as the upper surface of the first electrode 402, and across the block 409 and second sacrificial layer 408. Alternatively, the substantially planar upper surface 410 applies only to the upper surface of the first electrode 402.

FIG. 4B shows the BAW resonator 400 after selective removal of the first sacrificial layer 407, and first and second portions 416, 418 by one of a number of known methods, for example as described in referenced commonly owned U.S. Pat. No. 6,384,697 to Ruby, et al. Notably, the block 409 prevents removal of the second sacrificial layer 408 adjacent thereto, which is useful in providing the desired degree of planarity of the substantially planar upper surface 410.

The removal of the first sacrificial layer 407 and first and second portions 416, 418 reveals an acoustic reflector 412, a first cantilever 424, and a bridge 426 on opposing ends of the first electrode 402. Notably, the second electrode 404 is not disposed between the first electrode 402 and the acoustic reflector 412. Stated somewhat differently, the first electrode 402 is always disposed between the piezoelectric layer 403 and the acoustic reflector 412.

In accordance with a representative embodiment, and as described more fully below in connection with the representative embodiments of FIGS. 5A-5I, the second sacrificial layer 408 immediately adjacent to the block 409 is not removed.

Moreover, the removal of the first sacrificial layer 407 reveals first and second recessed frame elements ("innies") 440, 443, and a second raised frame element 445. As shown in FIG. 4B, first and second recessed frame elements 440, 443 are disposed on the surface of the first electrode 402 that is immediately adjacent to the acoustic reflector 412. Moreover, the first and second recessed frame elements 440, 443, and the second raised frame element 445 are disposed over the acoustic reflector 412.

The first cantilever 424 of the first electrode 402 extends over a gap 428, and effectively terminates the contacting overlap of the first electrode 402 with the acoustic reflector 412, the piezoelectric layer 403, and the second electrode 404 with the non-contacting sides of the first electrode 402. Generally, the first cantilever 424 is provided on at least one of the sides of the first electrode 402, but is not disposed on the connection side (i.e., the side of the first electrode 402 extending onto the substrate 401). Furthermore, the first cantilever 424 is illustratively disposed over the acoustic reflector 412.

The bridge 426 extends over an edge of the acoustic reflector 412 as shown, and effectively terminates the contacting overlap of the first electrode 402 with the acoustic reflector 412, the piezoelectric layer 403, and the second electrode 404, on the connection side of the first electrode 402.

The removal of the third sacrificial layer 455 reveals a second cantilever 460. The second cantilever 460 effectively terminates the contacting overlap of the second electrode 404 with the acoustic reflector, the piezoelectric layer 403, and the first electrode 402. Generally, the second cantilever 460 is provided on at least two of the sides of the second electrode 404, but is not disposed on the connection side of the second electrode 404. Additionally, the second cantilever 460 is illustratively disposed over the acoustic reflector 412.

The region of contacting overlap of the first and second electrodes 402, 404, the piezoelectric layer 403 and the acoustic reflector 412 is the active area of BAW resonator 400. By contrast, an inactive area of the BAW resonator comprises a region of overlap between first electrode 402, or the second electrode 404, or both, and the piezoelectric layer 403 not disposed over the acoustic reflector 412. As is known, it is beneficial to the performance of the BAW resonator 400 to reduce the magnitude of the area (i.e., the areal dimension) of the inactive region to the extent practical.

The first and second recessed frame elements 440, 443 may be disposed along one or more sides of the first electrode 402 of the BAW resonator 400, and on the surface of the first electrode 402 that is immediately adjacent to the acoustic reflector 412. The first and second recessed frame elements 440, 443 provide an acoustic mismatch at the perimeter of the first electrode 402, thereby improving signal reflections and reducing acoustic losses. Ultimately, reduced losses translate into an improved Q-factor of the device.

FIGS. 5A-5I are cross-sectional views of a fabrication sequence in accordance with a representative embodiment. Many aspects and details of the various components of the BAW resonator structure being fabricated according to the illustrative sequence are common to those described above in connection with representative embodiments of FIGS. 1A through 4B. These common aspects and details are not necessarily repeated, but are nonetheless contemplated by the description of the illustrative fabrication sequence.

Figure 5A:
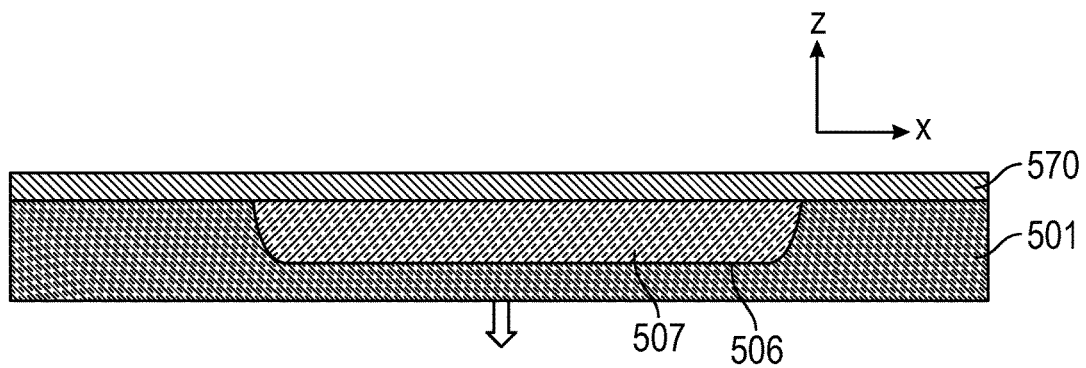
FIGS. 5A-5I are cross-sectional views of a fabrication sequence in accordance with a representative embodiment.

FIG. 5A shows a cross-sectional view of a substrate 501 having a cavity 506 formed therein by a known method. A first sacrificial layer 507 is disposed in the cavity. A sacrificial material 570 is disposed over upper surfaces of the substrate 501 and first sacrificial layer 507. As will become clearer as the present description continues, the sacrificial material 570 is used as a form for providing recessed frame elements (not shown in FIG. 5A) in a first electrode (not shown in FIG. 5A). The material selected for the sacrificial material 570 is selected for its etching properties relative to the material selected for the first electrode, as described more fully below. Moreover, sacrificial material 570 has a thickness (z-dimension in the z-dimension of FIG. 5A) selected to provide recessed frame elements of a desired depth (z-dimension) in the first electrode. In accordance with a representative embodiment, the sacrificial material comprises aluminum.

Figure 5B:
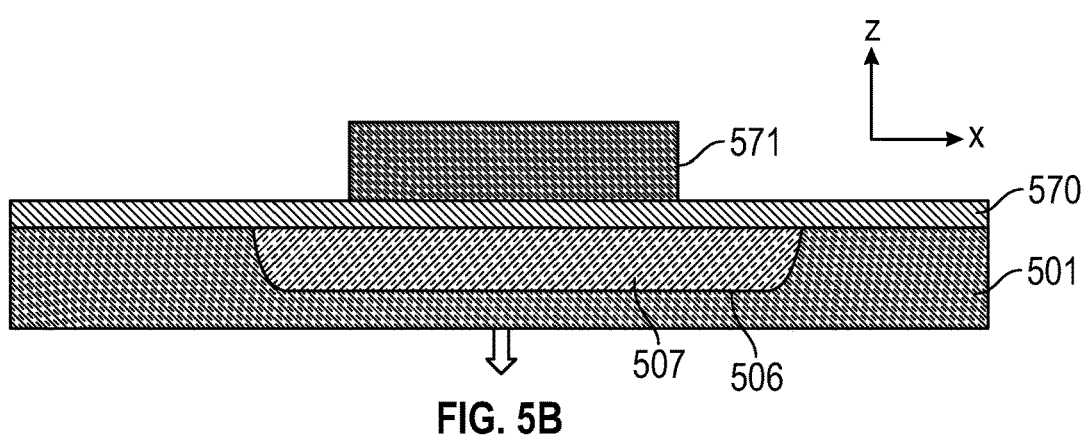

FIG. 5B shows a first resist layer 571 disposed over the sacrificial material 570. The first resist layer 571 protects the covered portion of the sacrificial material during an etching step. In accordance with a representative embodiment, this etching step comprises a (dry) plasma etch, such as a deep reactive ion etch (DRIE) (e.g., the Bosch Method) step that provides a comparatively precise etch of the sacrificial material 570 with a desired aspect ratio, resulting in vertical (z-direction) sides on the sacrificial material 570.

Figure 5C:
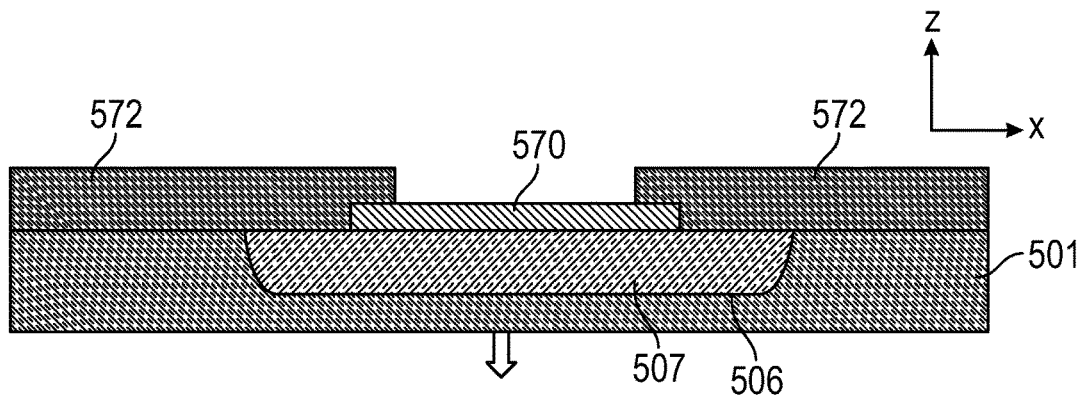

FIG. 5C shows the sacrificial material 570 after its partial etching, and after deposition of a second resist layer 572. The second resist layer 572 protects the portions of the sacrificial material 570 that are desirably thicker (z-direction). These portions are used for forming the recessed frame elements.

Figure 5D:
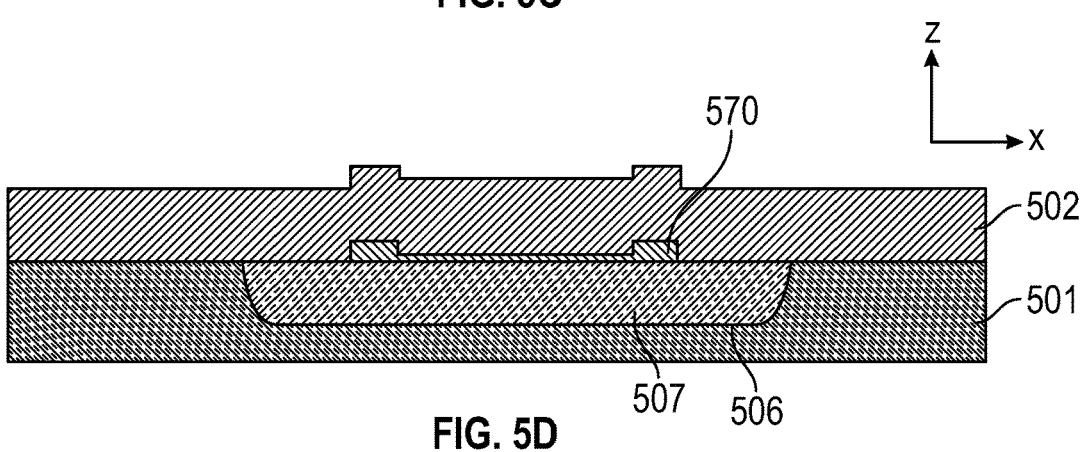

FIG. 5D shows the result after the selective etching of the sacrificial material 570, and the subsequent deposition of a first electrode 502. Notably, this selective etching is also effected using a (dry) plasma etch, such as a deep reactive ion etch (DRIE) (e.g., the Bosch Method) step that provides a comparatively precise etch of the sacrificial material 570 with a desired aspect ratio, resulting in vertical (z-direction) sides on the portions of the sacrificial material 570 used for the forms of the recessed frame elements on the first electrode 502.

Figure 5E:
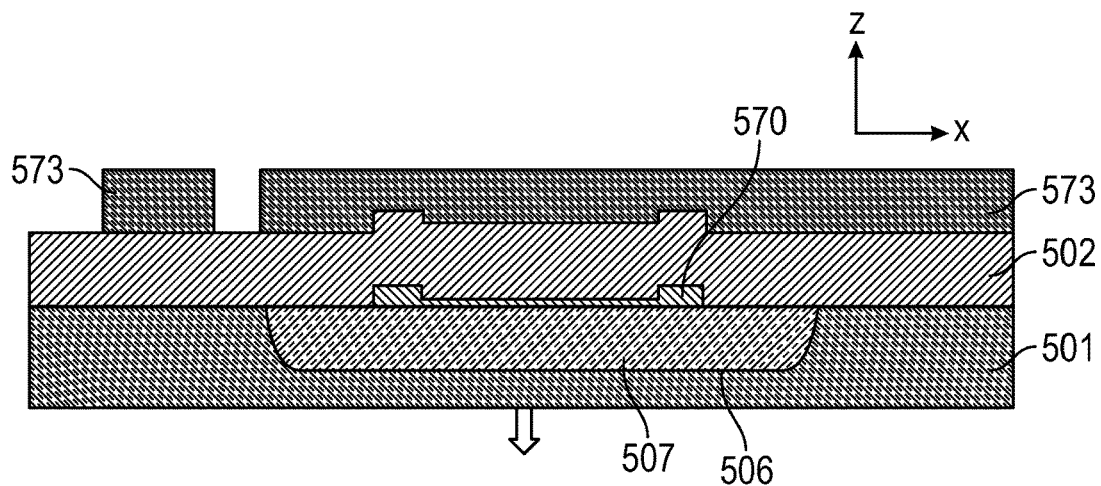

FIG. 5E shows a third resist 573 selectively disposed over an upper surface of the first electrode 502.

Figure 5F:
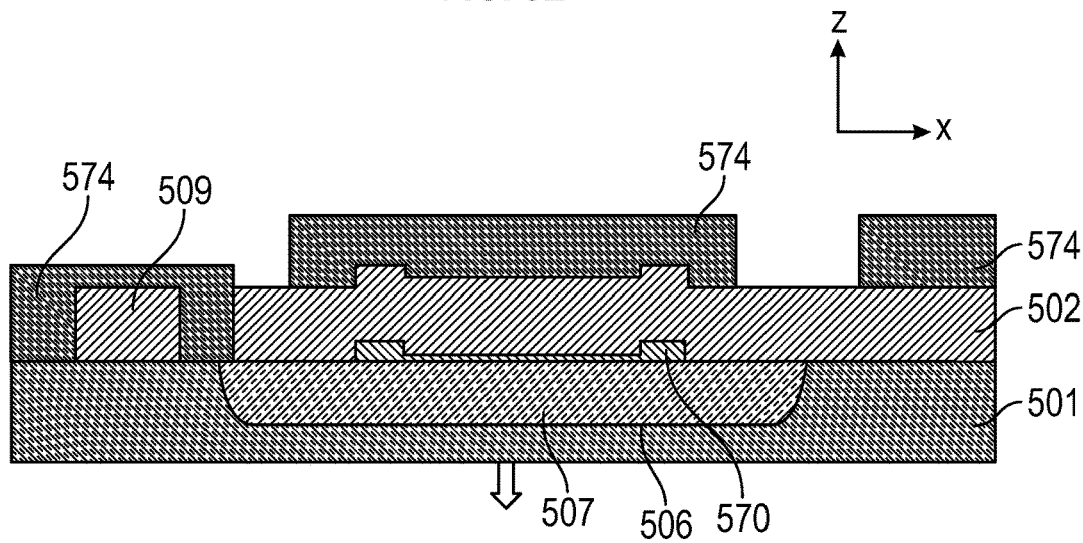

FIG. 5F shows the result after another (dry) plasma etch, such as a deep reactive ion etch (DRIE), which results in the formation of the block 509. As described in connection with various representative embodiments above, the block 509 plays a role in providing a substantially planar upper surface 510 that is atomically smooth to ensure the fabrication of a substantially defect-free, highly textured piezoelectric layer thereover. As such, the etch step of FIG. 5F results in a substantially planar (x-y plane of the coordinate system of FIG. 5F) upper surface 510 with a substantially uniform height (z-direction) thereacross. FIG. 5F also shows a fourth resist 574 selectively disposed over the first electrode 502 and the block 509.

Figure 5G:
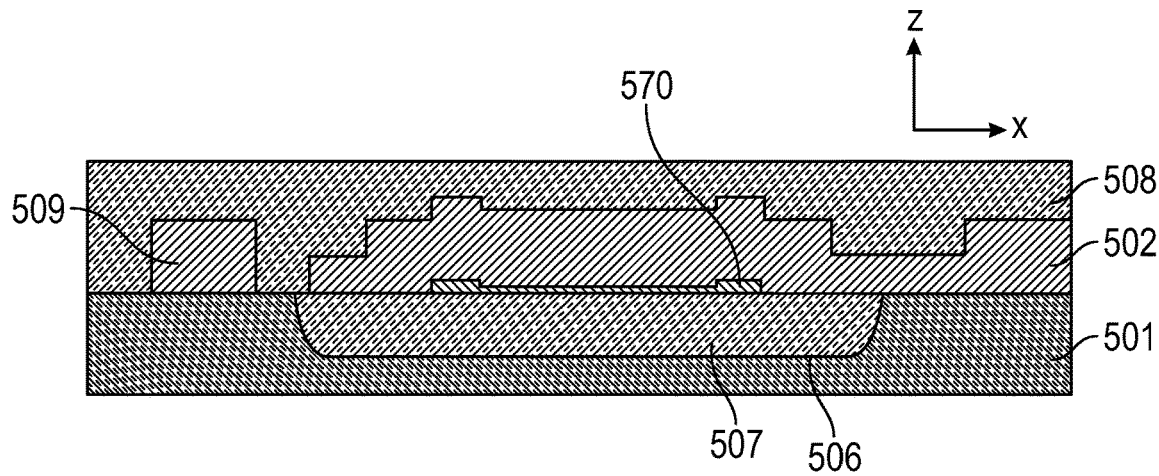

FIG. 5G shows the result after the next (dry) plasma etch, such as a deep reactive ion etch (DRIE), and the deposition of the second sacrificial layer 508.

Figure 5H:
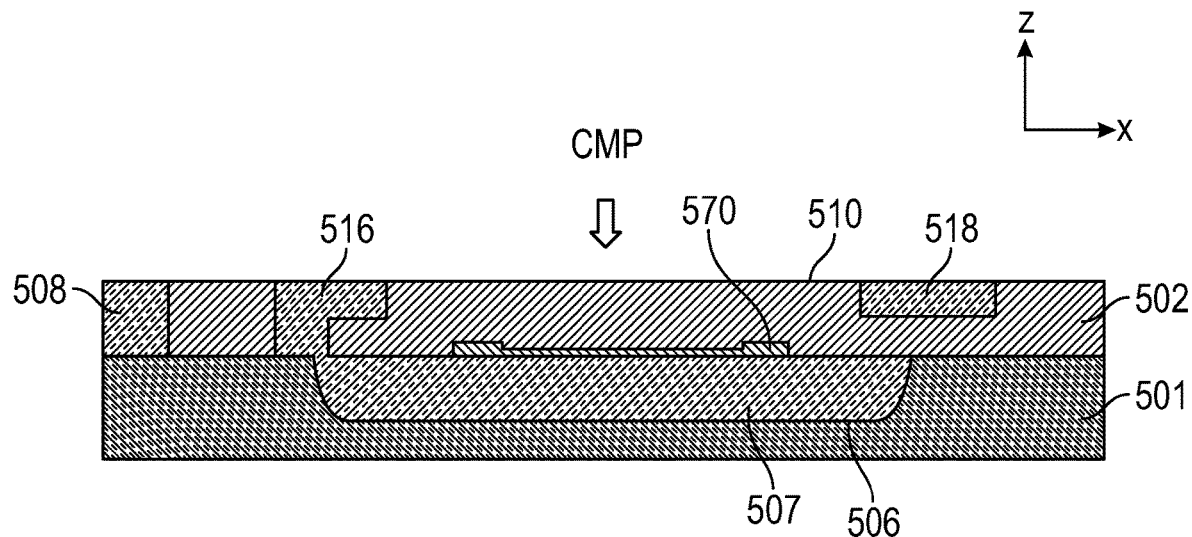

FIG. 5H shows the result after a CMP step in accordance with a representative embodiment. As noted above, this CMP step results in a substantially planar upper surface 510 that is beneficially "atomically smooth." As noted above, in accordance with a representative embodiment, this CMP step is carried out for example, according to the teachings of U.S. Pat. Nos. 6,060,818, and 6,060,818C1 (Reexamination Certificate), to Ruby et al. As noted above, as used herein, an atomically smooth surface has an RMS variation in height of in the range of approximately 0.1 Å to approximately 10.0 Å; although beneficially, the RMS variation in height is less than approximately 5.0 Å. In some embodiments, the RMS variation in height of the substantially planar upper surface 510 is less than approximately 5.0 μm.

Notably, while it is useful to provide the degree of planarity of the substantially planar upper surface 510 of the first electrode 502 so that a highly textured piezoelectric layer can be formed thereover, this degree of planarity can extend across the block 509 and second sacrificial layer 508. Therefore, in some representative embodiments, the substantially planar upper surface 510 is provided as the upper surface of the first electrode 502, and across the block 509 and second sacrificial layer 508. Alternatively, the substantially planar upper surface 510 applies only to the upper surface of the first electrode 502.

As shown, this CMP step reveals a recess 520 in the first electrode 502, which is substantially filled by a first portion 516 of the second sacrificial layer 508. Moreover, an opening 522 is also provided in the first electrode 502, and is substantially filled by a second portion 518 of the second sacrificial layer 508.

Figure 5I:
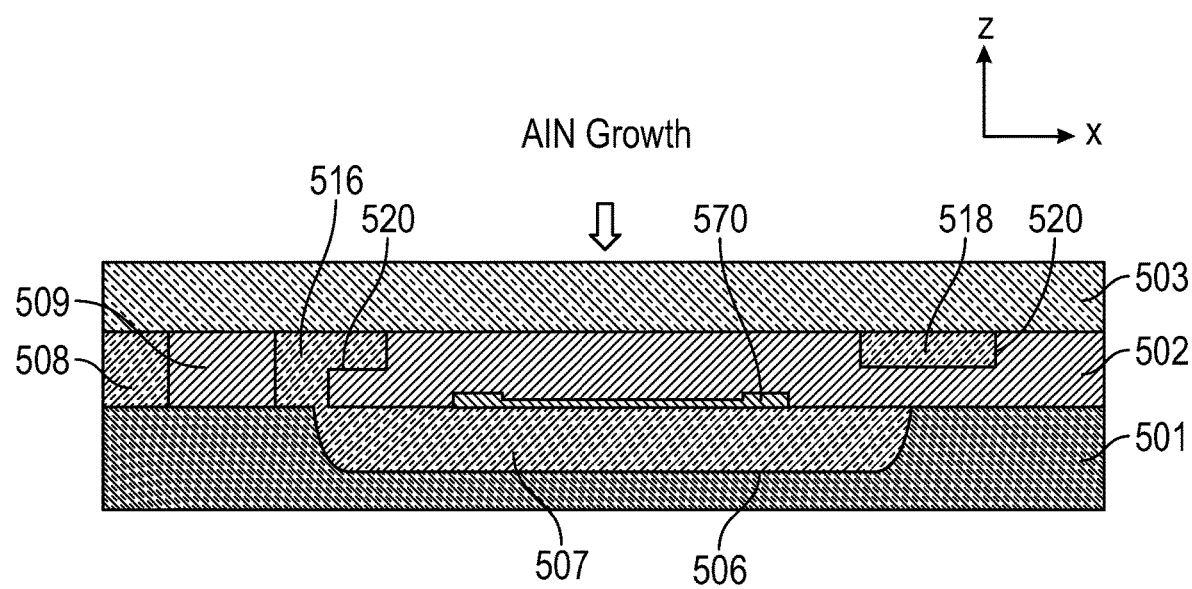

FIG. 5I shows the growth of a piezoelectric layer 503 using a known method. Again, because of the substantially planar, atomically smooth planar upper surface 510, the piezoelectric layer 503 is substantially defect free, and highly textured.

The sequence of fabricating the remaining features of a BAW acoustic resonator (e.g., second electrode with bridges, recessed frame elements, or raised frame elements, or a combination thereof) is the carried out using the structure of FIG. 5I.

After completion of the structure depicted in FIG. 5I, and although not shown, a subsequent etching step is carried out to remove the second sacrificial layer 508, the first sacrificial layer 507, and the first and second portions 516, 517, using suitable etching methods and materials for the materials used for the second sacrificial layer 508, the first sacrificial layer 507, and the first and second portions 516, 517. Thereafter, and again not shown subsequent fabrication steps are carried out using known methods and materials to form a second electrode (not shown), optionally including but not limited to, frame elements (not shown), and cantilevers (not shown).

Figure 6:
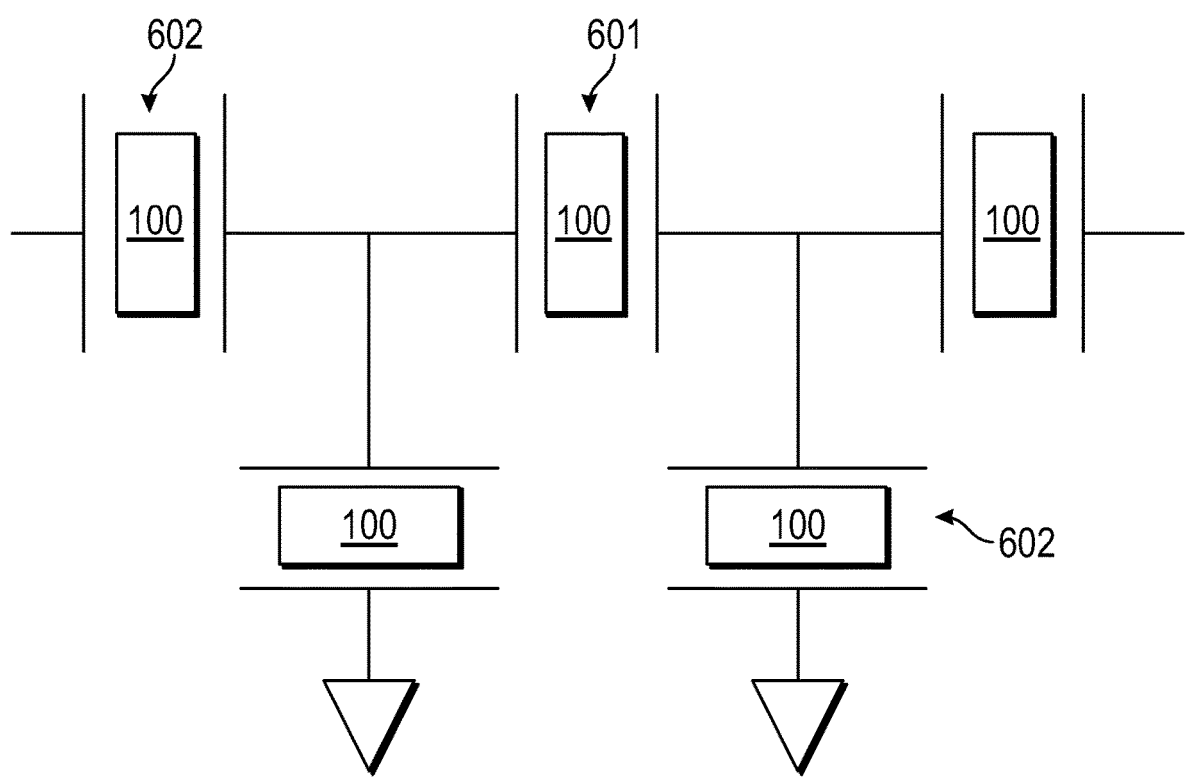
FIG. 6 is a simplified schematic diagram of an electrical filter in accordance with a representative embodiment.

When connected in a selected topology, a plurality of BAW resonators 100, 200, 300, 400 can function as an electrical filter. FIG. 6 shows a simplified schematic block diagram of an electrical filter 600 in accordance with a representative embodiment. The electrical filter 600 comprises series acoustic resonators 601 and shunt acoustic resonators 602. The series resonators 601 and shunt resonators 602 may comprise the BAW resonators 100, 200,300, 400 described in connection with the representative embodiments of FIGS. 1A-4B. The electrical filter 600 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 600 is merely illustrative and other topologies are contemplated. Moreover, the acoustic resonators of the representative embodiments are contemplated in a variety of applications besides duplexers.

In accordance with illustrative embodiments, acoustic resonators for various applications such as in electrical filters are described as having an electrode comprising a cantilevered portion. Additionally, acoustic resonators for various applications such as in electrical filters are described as having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. A bulk acoustic wave (BAW) resonator, comprising:
an active area comprising an overlap of an acoustic reflector, a bottom electrode, a piezoelectric layer and a top electrode;
a substrate disposed below the active area;
a block disposed over the substrate adjacent to but separated from the active area; and
a sacrifial layer disposed over the substrate and immediately adjacent to the block.

2. The BAW resonator of claim 1, wherein an upper surface of the block is substantially coplanar with an upper surface of the bottom electrode and wherein the block and the bottom electrode are formed of a same material.

3. An acoustic resonator, comprising:
a substrate;
an acoustic reflector disposed over an upper surface of the substrate;
a bottom electrode disposed over the acoustic reflector;
a piezoelectric layer disposed over the bottom electrode;
a top electrode disposed over the piezoelectric layer; and
a block disposed over the substrate, wherein the block is positioned above both the substrate and the acoustic reflector in a first direction that is perpendicular to the upper surface of the substrate, wherein an upper surface of the block is substantially coplanar with an upper surface of the bottom electrode, and wherein the block and the bottom electrode are formed of a same material.

4. The acoustic resonator of claim 3, wherein the substrate comprises an air cavity.

5. The acoustic resonator of claim 3, where the block is further positioned beside the bottom electrode, in a second direction that is perpendicular to the first direction, and separated from the bottom electrode by a space.

6. The acoustic resonator of claim 5, wherein the block and the bottom electrode have substantially coplanar upper surfaces.

7. The acoustic resonator of claim 6, wherein the substantially coplanar upper surfaces of the block and the bottom electrode form a combined upper surface having a root mean square (RMS) variation in height in a range of approximately 0.1 A to approximately 10.0 A, enabling substantially defect-free growth of the piezoelectric layer on the combined upper surface.

8. The acoustic resonator of claim 3, further comprising:
a sacrificial layer disposed over the substrate and immediately adjacent to the block.

9. A bulk acoustic wave (BAW) resonator, comprising:
a substrate;
an acoustic reflector disposed adjacent to the substrate;
a first electrode disposed over the acoustic reflector;
a piezoelectric layer disposed over the first electrode;
a second electrode disposed over the piezoelectric layer;
a block disposed over the substrate and beneath the piezoelectric layer, and separated from the acoustic reflector by a space; and
a sacrificial layer disposed over the substrate and immediately adjacent to the block.

10. The BAW resonator of claim 9, wherein the block is a first block, and the first block is disposed at one end of the first electrode, and the BAW resonator further comprises a second block disposed on another end opposing the one end of the first electrode.

11. The BAW resonator of claim 9, wherein the block is positioned between the sacrificial layer and an end of the first electrode.

12. The BAW resonator of claim 9, wherein the acoustic reflector has a plurality of edges, and the first electrode does not extend over any of the plurality of edges.

13. The BAW resonator of claim 9, wherein the acoustic reflector has a plurality of edges, and the first electrode extends over only one of the plurality of edges.

14. The BAW resonator of claim 9, wherein the block is disposed on a first side of the acoustic reflector, and the first electrode extends over an edge on a second side of the acoustic reflector, and
wherein a bridge in the first electrode extends over the edge on the second side of the acoustic reflector.

15. The BAW resonator of claim 14, wherein the bridge is disposed on an upper surface of the first electrode, the upper surface of the first electrode being immediately adjacent to the piezoelectric layer.

16. The RAW resonator of claim 15, further comprising a recessed frame element, or a raised frame element, or both, on a lower surface of the first electrode, the lower surface of the first electrode being immediately adjacent to the acoustic reflector.

17. The BAW resonator of claim 14, wherein the first electrode has a first end and a second end opposing the first end, wherein the bridge exists at the second side of the first electrode, and the BA W resonator further comprises a cantilevered portion at the first side of the first electrode.

18. The BAW resonator as claimed in claim 17, wherein the bridge and the cantilevered portion are disposed over an upper surface of the first electrode, and the first electrode comprises a recessed frame element, or a raised frame element, or both, at a lower surface of the first electrode.

19. The BAW resonator as claimed in claim 18, wherein the second electrode comprises another recessed frame element, or another second raised frame element, or both.

20. The RAW resonator of claim 9, wherein a size of the first electrode sets an areal dimension of an active area of the BAW resonator.

21. The BAW resonator of claim 9, wherein an upper surface of the block is substantially coplanar with an upper surface of the first electrode.

22. The RAW resonator of claim 21, wherein the block and the first electrode are formed of a same material.

23. The RAW resonator of claim 22, wherein the substantially coplanar upper surfaces of the block and the first electrode are atomically smooth.

24. The BAW resonator of claim 9, wherein the space separating the block and the acoustic reflector is configured to decouple a portion of an acoustic stack comprising the first electrode, the second electrode and the piezoelectric layer.

* * * * *